United States Patent
Stevenson et al.

(10) Patent No.: US 11,235,971 B2
(45) Date of Patent: *Feb. 1, 2022

(54) SINGULATION OF WAFER LEVEL PACKAGING

(71) Applicant: TEXAS INSTRUMENTS INCORPORATED, Dallas, TX (US)

(72) Inventors: Clayton Lee Stevenson, Fort Worth, TX (US); Frank Odell Armstrong, Terrell, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 11 days.

This patent is subject to a terminal disclaimer.

(21) Appl. No.: 16/840,625

(22) Filed: Apr. 6, 2020

(65) Prior Publication Data

US 2020/0231434 A1 Jul. 23, 2020

Related U.S. Application Data

(63) Continuation of application No. 16/236,430, filed on Dec. 29, 2018, now Pat. No. 10,611,632.

(51) Int. Cl.
*B81C 1/00* (2006.01)
*B81C 99/00* (2010.01)
*G02B 26/08* (2006.01)

(52) U.S. Cl.
CPC ...... *B81C 1/00896* (2013.01); *B81C 1/00317* (2013.01); *B81C 99/004* (2013.01); *G02B 26/0833* (2013.01); *B81C 2203/0118* (2013.01)

(58) Field of Classification Search
None
See application file for complete search history.

(56) References Cited

U.S. PATENT DOCUMENTS

| | | | |
|---|---|---|---|
| 7,622,324 B2 | 11/2009 | Enquist et al. | |
| 10,611,632 B1* | 4/2020 | Stevenson | B81C 99/004 |
| 2004/0002215 A1 | 1/2004 | Dewa | |
| 2005/0042792 A1 | 2/2005 | Patel et al. | |
| 2008/0164592 A1 | 7/2008 | Bakke et al. | |
| 2017/0044009 A1 | 2/2017 | Jacobs | |
| 2018/0068974 A1 | 3/2018 | Lin et al. | |
| 2019/0330052 A1 | 10/2019 | Lee et al. | |

* cited by examiner

*Primary Examiner* — Asok K Sarkar
(74) *Attorney, Agent, or Firm* — Michelle F. Murray; Charles A. Brill; Frank D. Cimino (57) ABSTRACT

A method includes, before attaching a window assembly to a semiconductor wafer, the semiconductor wafer including a plurality of integrated circuits and each integrated circuit including an electrical connection pad, adhering the window assembly to a carrier fixture. The method further includes, before attaching the window assembly to the semiconductor wafer, removing portions of the window assembly to create removal areas. The method then includes attaching the window assembly to the semiconductor wafer such that the electrical connection pad of each of the plurality of integrated circuits is within a removal area and removing the carrier fixture leaving the window assembly adhered to the semiconductor wafer with the electrical connection pad exposed of each of the plurality of integrated circuits.

20 Claims, 8 Drawing Sheets

SINGULATION OF WAFER LEVEL PACKAGING

CROSS-REFERENCE TO RELATED APPLICATION

This application is a continuation of U.S. patent application Ser. No. 16/236,430 filed Dec. 29, 2018, the entirety of which is incorporated herein by reference.

BACKGROUND

In wafer level packaging, the packaging process for individual semiconductor dies begins before the semiconductor wafer has been singulated into the individual dies and the dies removed from a chuck on which the semiconductor wafer is adhered. In some cases, the semiconductor wafer is adhered to the chuck and singulated while still on the chuck. A packaging material (e.g., glass) can then be placed over the semiconductor wafer and further processed as part of the packaging process. It is possible that portions of the semiconductor wafer become damaged while processing the packing material over the wafer. For example, portions of the glass may be removed and the glass portion removal process may result in damage to the underlying semiconductor wafer.

SUMMARY

In some examples, a method includes, before attaching a window assembly to a semiconductor wafer, the semiconductor wafer including a plurality of integrated circuits and each integrated circuit including an electrical connection pad, adhering the window assembly to a carrier fixture. The method further includes, before attaching the window assembly to the semiconductor wafer, removing portions of the window assembly to create removal areas. The method then includes attaching the window assembly to the semiconductor wafer such that the electrical connection pad of each of the plurality of integrated circuits is within a removal area and removing the carrier fixture leaving the window assembly adhered to the semiconductor wafer with the electrical connection pad exposed of each of the plurality of integrated circuits.

DETAILED DESCRIPTION OF EXAMPLE EMBODIMENTS

As described above, damage can occur to a semiconductor wafer during wafer level packaging. The described examples reduce or avoid such damage by partially modifying a component to be placed over the wafer before the component is actually placed over the wafer. The partially modified component is then adhered to the wafer, thereby avoiding the damage that would have otherwise occurred to the wafer.

Figure 1:
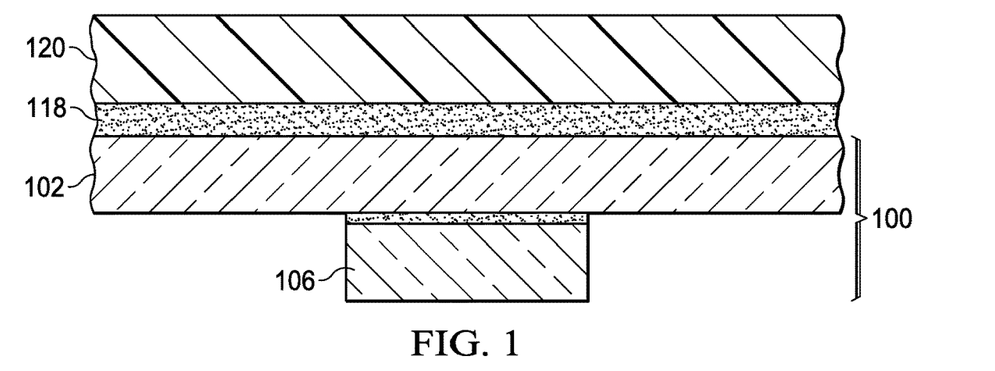
FIGS. 1-5 illustrate a wafer-level sequence of operations in accordance with an example.
Figure 2:
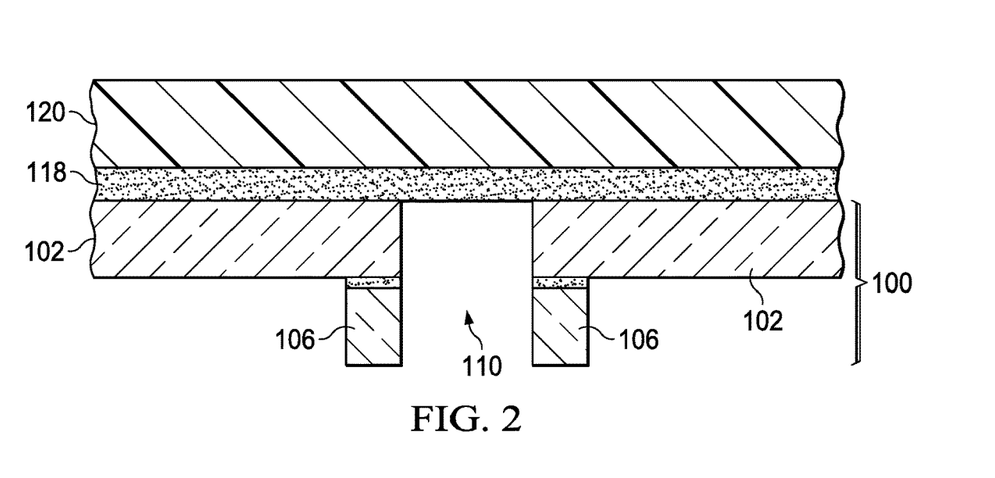
Figure 3:
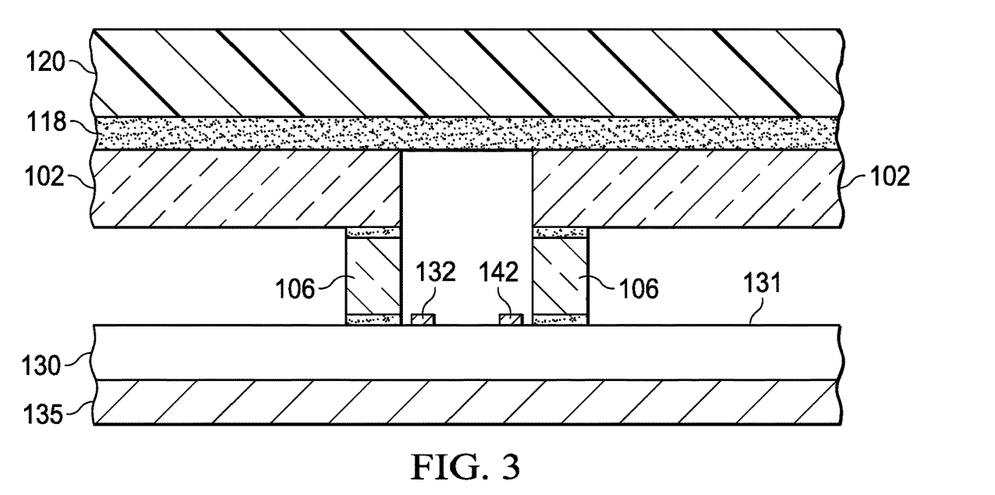

FIGS. 1-5 illustrate an example of a time sequence of operations for wafer level processing. FIG. 1 illustrates a wafer 100 that is to be adhered to another wafer 130 (FIG. 3). In one example, wafer 130 is a semiconductor wafer including a plurality of integrated circuits, such as digital micromirror devices (DMDs), and the wafer 100 is a glass (or other type of optically translucent material) wafer. In the example below, the wafer 100 is made from glass and is thus referred to as a window assembly 100. The window assembly 100 includes a glass layer 102 and an interposer 106. The interposer 106 may be made from an optically translucent material such as glass and is adhered to the glass layer by way of, for example, glue or other type of adhesive. The interposer 106 functions as a standoff to ensure that the glass layer 102 is not in contact with the underlying wafer 130, especially not in contact with certain areas of wafer 130. In the example in which DMDs are formed on wafer 130, multiple movable mirrors are formed on the surface 131 (FIG. 3) of the wafer 130 and the interposer 106 prevents the glass layer 102 from contacting and damaging the mirrors. The interposer 106 does contact wafer 130 but not in areas on the surface 131 of the wafer 130 that includes mirrors or other components that would be damaged by the interposer 106. In this example, the window assembly 100 comprises two components (glass layer 102 and interposer 106). In other example, however, the window assembly 100 comprises a unitary glass member.

A carrier fixture 120 is attached to the window assembly as shown in FIG. 1. The carrier fixture 120 is attached to the window assembly by way of a tape 118. All references to the tape 118 herein also include any type of a temporary adhesive. The carrier fixture 120 may be made from metal, plastic, or other suitable material to provide support to the window assembly 100 as it is handled during wafer-level packaging. The tape 118 temporarily adheres the window assembly 100 to the carrier fixture 120 so that portions of the window assembly can be removed to create removal areas 110 (FIG. 2). The tape can be an ultra-violet (UV) releasable tape meaning that the adhesive capability of the tape is degraded upon exposure to UV light. Each removal area 110 is made, for example, by a saw or other type of material removal process. The removal area 110 is formed in the window assembly 100 before the window assembly is adhered to the wafer 130 thereby avoiding damage to wafer 130 that might otherwise occur if portions of the window assembly were removed while the window assembly was already adhered to the wafer 130.

Figure 4:
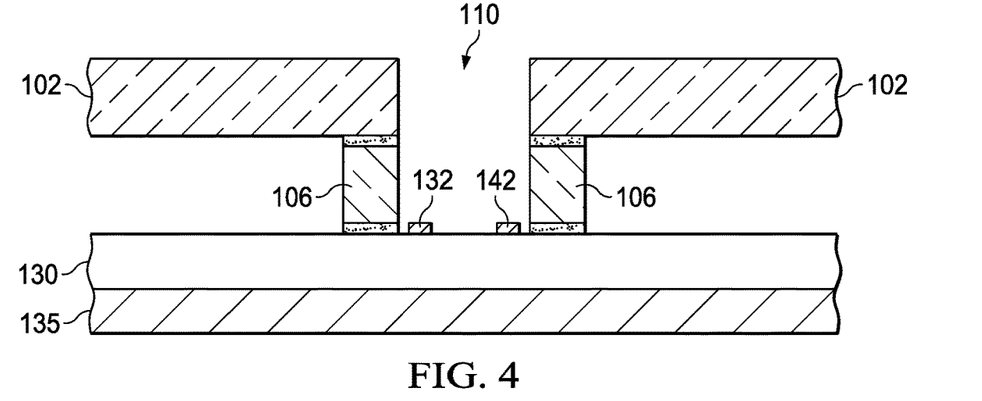
Figure 5:
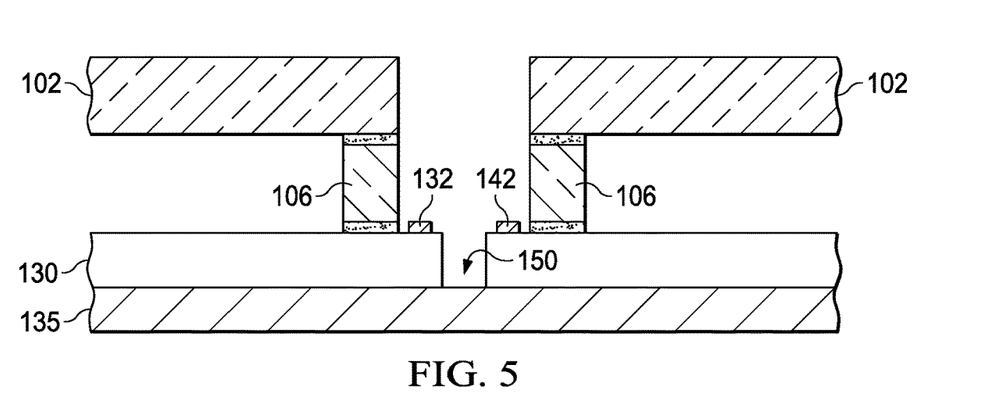
Figure 6:
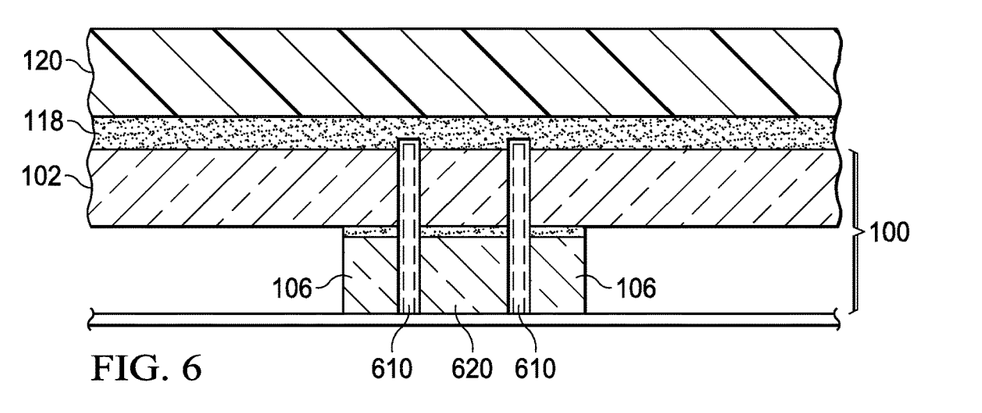
FIGS. 6-10 illustrate a wafer-level sequence of operations in accordance with another example in which a removable portion is removed in conjunction with removal of the carrier fixture.

After the removal areas 110 are formed in the window assembly, the window assembly 100 is then adhered to wafer 130 as shown in FIG. 3. The wafer 130 itself may be attached to a chuck 135 to support the wafer during the wafer-level packaging. Glue or other type of adhesive mechanism can be used to adhere the window assembly 100 to the wafer 130. Wafer 130 also includes multiple electrical connection pads such as electrical connection pads 132 and 142 as shown in FIGS. 3-5. Each electrical pad provides electrical connectivity to an associated integrated circuit formed within wafer 130.

FIG. 4 illustrates that carrier fixture 120 has been removed. As described above, carrier fixture 120 is adhered to the window assembly by way of a temporary adhesive, for example, a UV-releasable tape 118. In the example of a UV-releasable tape, the tape 118 is exposed to UV light for a suitable period of time. The adhesive capability of tape 118 degrades to the point that the carrier fixture 120 can be removed from the window assembly 100. Absent the carrier fixture 120, electrical connection pads 132, 142 are exposed thereby permitting the various integrated circuits (e.g., DMDs) to be electrically tested. The electrical testing is thus performed on the various integrated circuits before the wafer 130 is singulated into individual dies. Further, if the window assembly 100 were to be adhered to the wafer 130 before the removal areas 110 are formed, then portions of the window assembly would need to be removed to provide access to the electrical connection pads 132, 142 for testing. Removal of portions of the window assembly 100 while adhered to the wafer might damages the integrated circuits and electrical connections in the areas where the glass comprising the window assembly 100 is being broken off to be removed. By removing portions of the window assembly to create the removal areas 110 before the window assembly 100 is attached to the wafer 130, such damage is avoided.

The testing of the individual integrated circuits helps to determine which integrated circuits are acceptable and which are not. Integrated circuits that do not pass the testing can be discarded.

FIG. 5 illustrates that, after the testing, the wafer 130 is singulated into its individual dies. A saw, or type of wafer singulation device, can be used to saw through the wafer 130.

Figure 7:
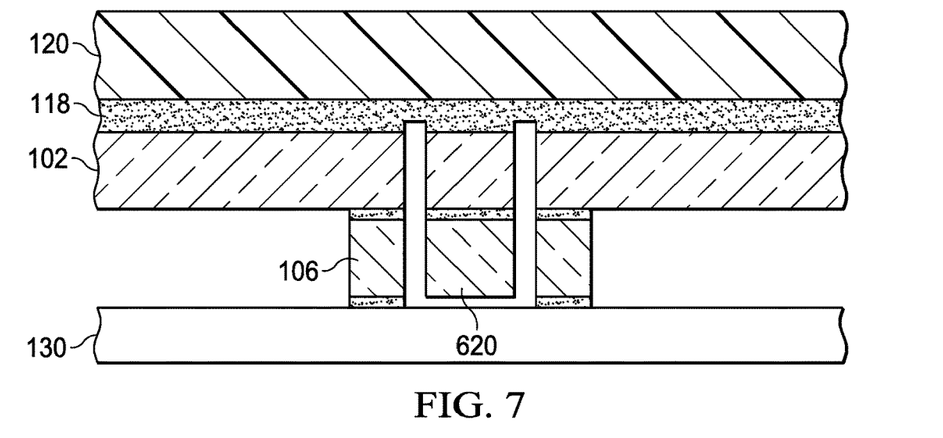

FIGS. 6-10 illustrate another example of creating the removal areas in a window assembly. Rather than cutting one wider notch through the window assembly (as in FIG. 2), in the example of FIG. 6, two narrower cuts 610 are made through the window assembly 100 as shown. In one example, cuts 610 are spaced approximately 1 mm apart. The portion 620 of the window assembly between the two cuts 610 is a removal portion and may be referred to as a "swizzle stick". The combination of the window assembly 100 and carrier fixture 120 is then adhered to the wafer 130 as shown in FIG. 7. Glue is used to adhere the interposer to the wafer 130, but glue is not included at the interface between the portion 620 and the wafer 130.

Figure 8:
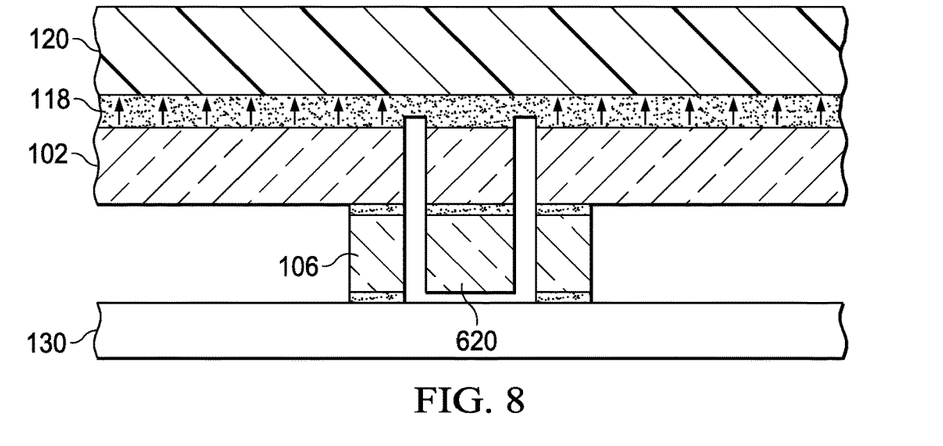
Figure 9:
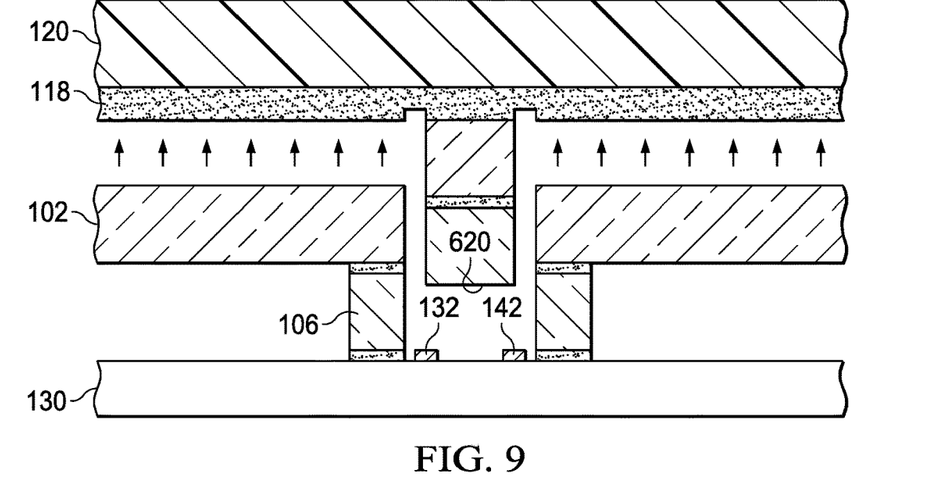
Figure 10:
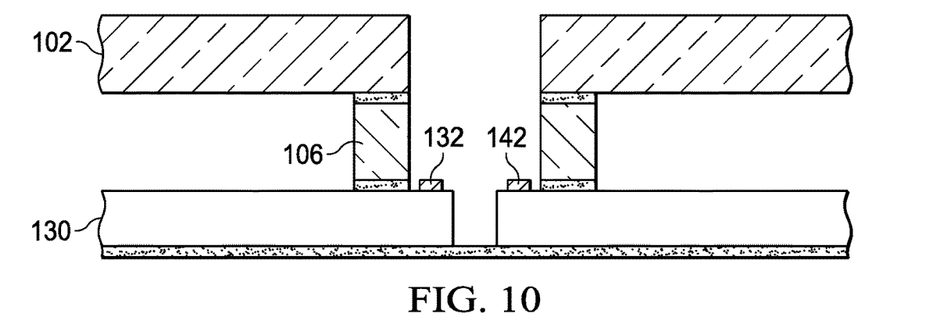
Figure 11:
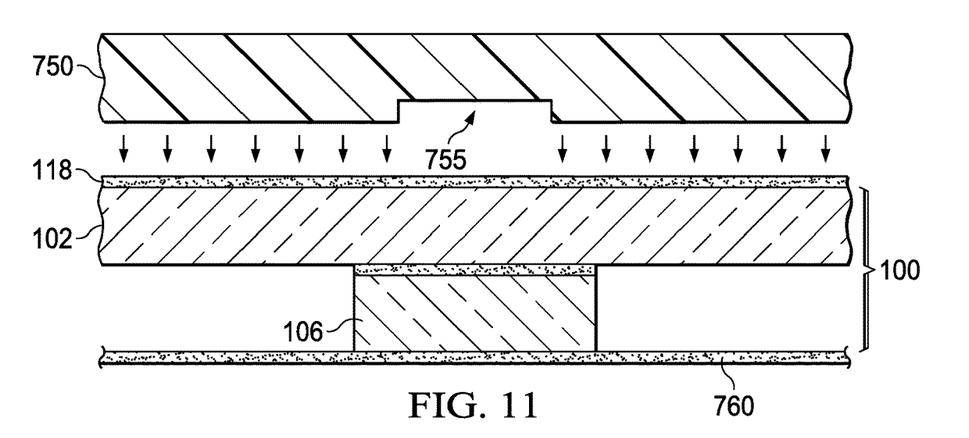
FIGS. 11-16 illustrate a wafer-level sequence of operations in accordance with yet another example.

FIGS. 8 and 9 illustrate that the tape 118 is deactivated. The tape 118 is selectively deactivated. For example, the tape 118 is exposed to UV light at areas of the tape 118 other than at portions 620. The carrier fixture 120 is removed from the window assembly 100. Because the adhesive capability of the tape 118 is not deactivated at portions 620, portions 620 are removed along with the carrier fixture as shown in FIG. 9. The electrical connection pads 132, 142 can be tested as described above, and then the wafer 130 can be singulated into its constituent dies (FIG. 10).

Figure 12:
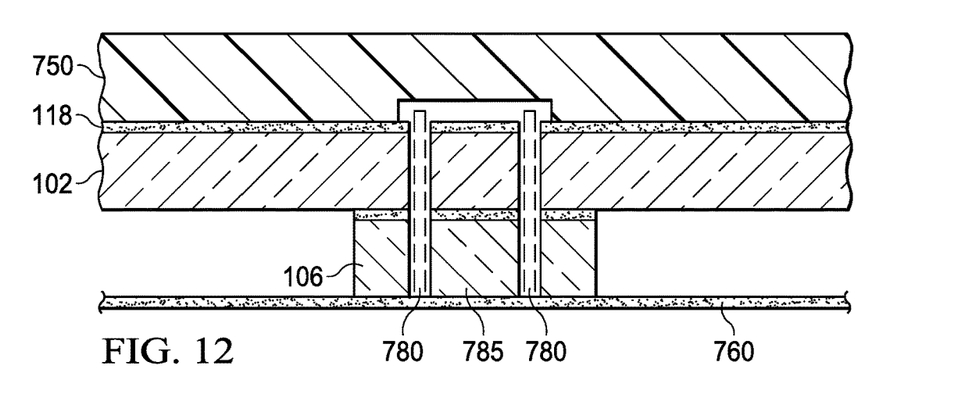
Figure 13:
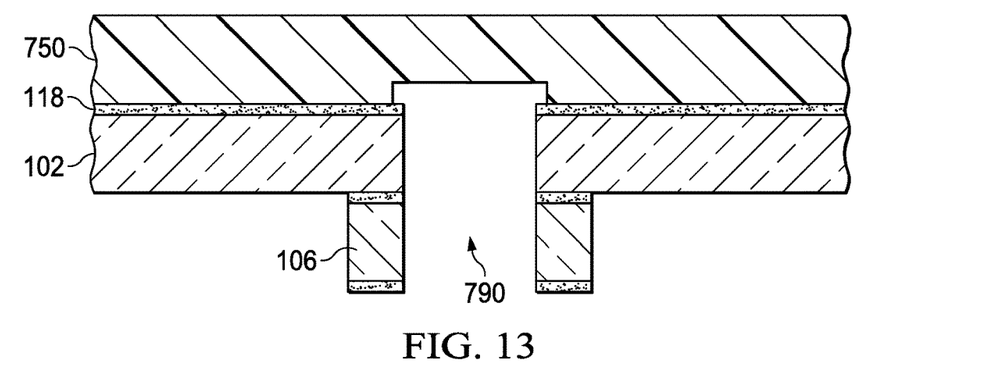

FIGS. 11-16 illustrate another example of wafer-level packaging. A carrier fixture 750 is adhered to the window assembly 100 as described above using a releasable (e.g., UV-releasable) tape 118. The window assembly may be temporarily placed on tape 760. The carrier fixture 750 includes cut-outs 755 formed within the surface of the carrier fixture to be adhered to the window assembly 100. FIG. 12 shows that a pair of cuts 780 are made all of the way through the window assembly and into the cut-out 755. As the cuts 780 are made all of the way through the interposer 106 and glass layer 102, the portion 785 of the window assembly 100 between the cuts 780 can then be removed as shown in FIG. 13 to create removal areas 790.

Figure 14:
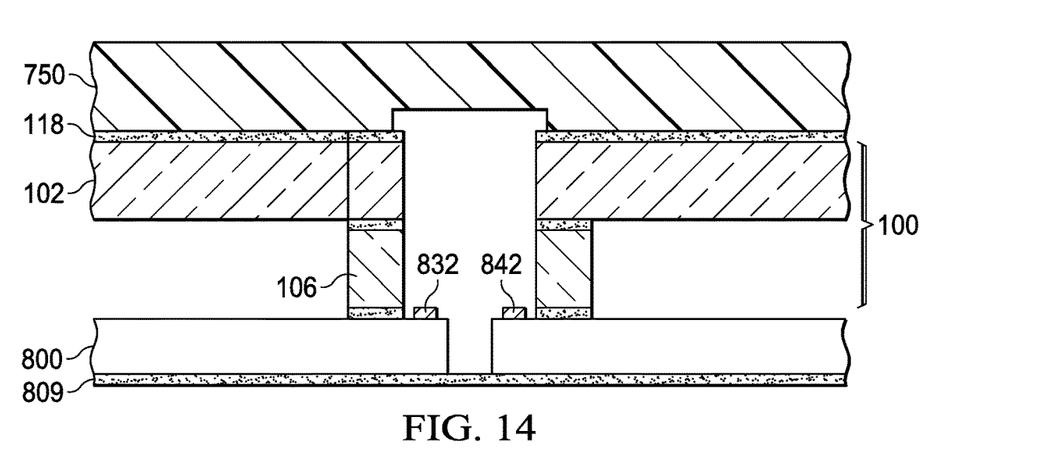
Figure 15:
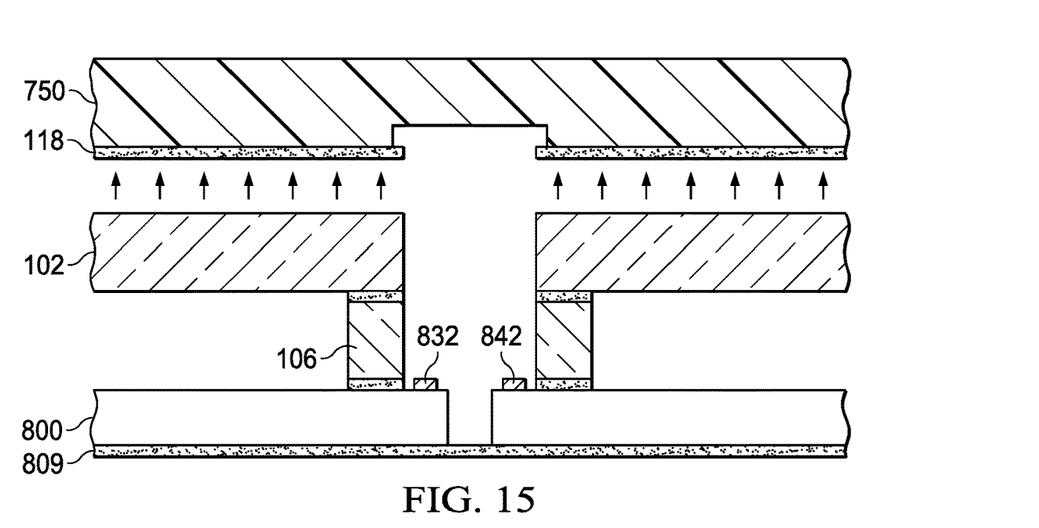
Figure 16:
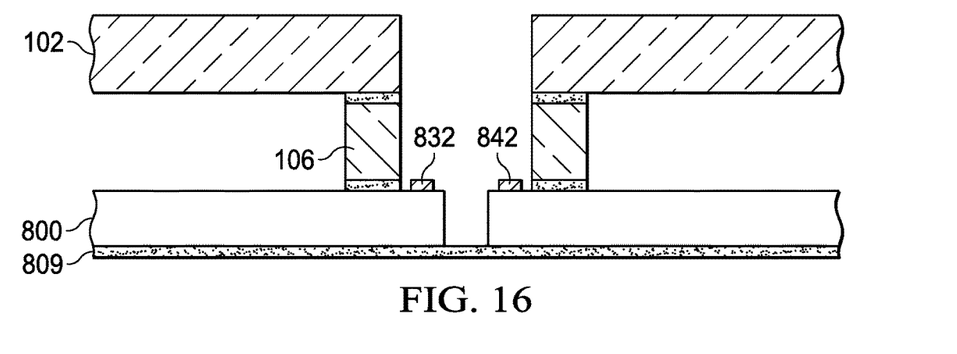

FIG. 14 that a wafer 130 has been singulated and then the window assembly 100 and carrier fixture 750 adhered to the singulated wafer 800. Although singulated, the individual dies comprising the wafer 800 remain held in place by tape 809. In FIG. 15, the tape is deactivated (e.g., through exposure to UV light) to thereby permit the carrier fixture 750 to be removed. FIG. 16 illustrates that the electrical connection pads 832 and 842 of associated integrated circuits of the individual dies can then be tested.

Figure 17:
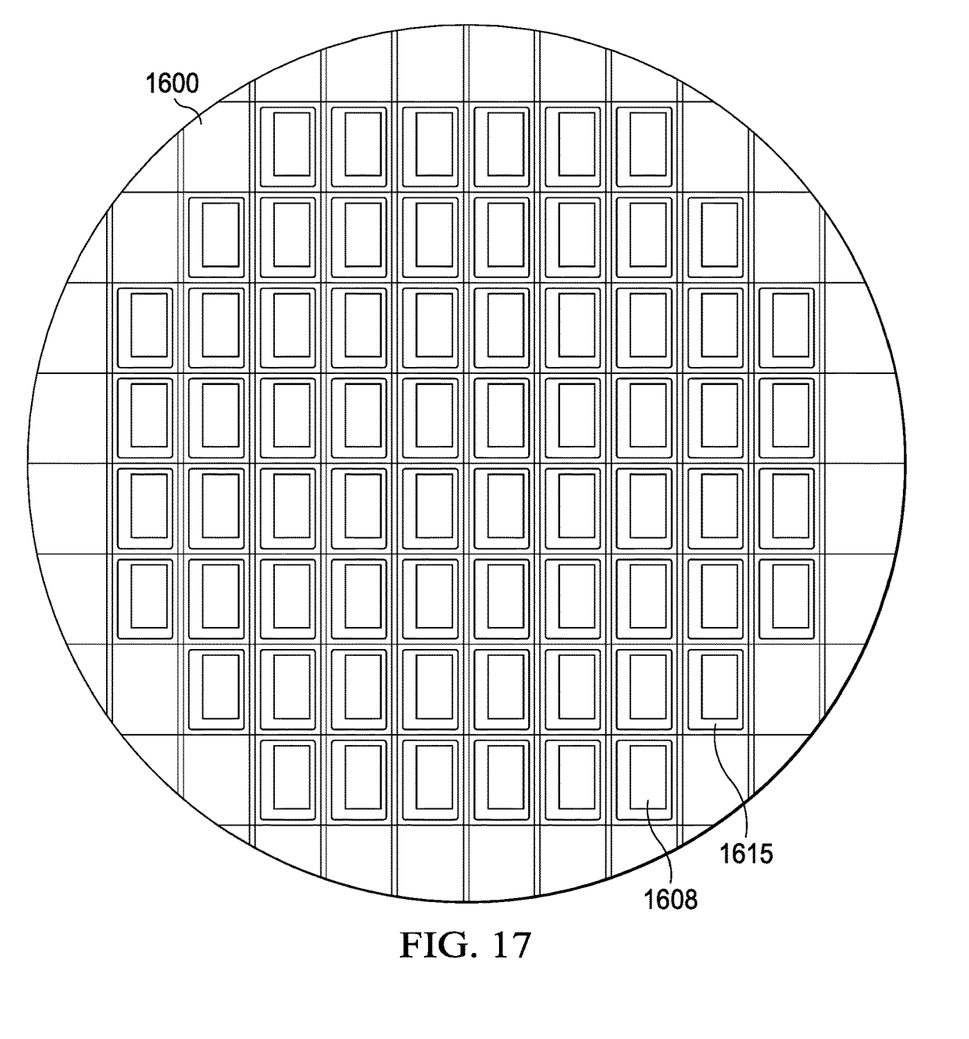
FIG. 17 shows a top view of a wafer in accordance with an example.

FIG. 17 shows an example of top view of a wafer 1600 illustrating multiple integrated circuits 1608 and interposer openings 1615. The interposer openings 1615 cover the integrated circuits 1608 as noted above. The glass layer 102 is not specifically shown in the top view for clarity.

The examples described above represent epoxy-based wafer-level packaging in that an epoxy-based adhesive may be used to adhere the carrier fixture 120, 750 to the window assembly 100 and to adhere the window assembly 100 to the wafer 130, 800. FIGS. 18-21 illustrate wafer-level packaging using hermetic bonding. A hermetic bond is any bond that forms a hermetic seal between the window assembly 100 and the wafer 130, 800 preventing the permeation of gasses into the package.

Figure 18:
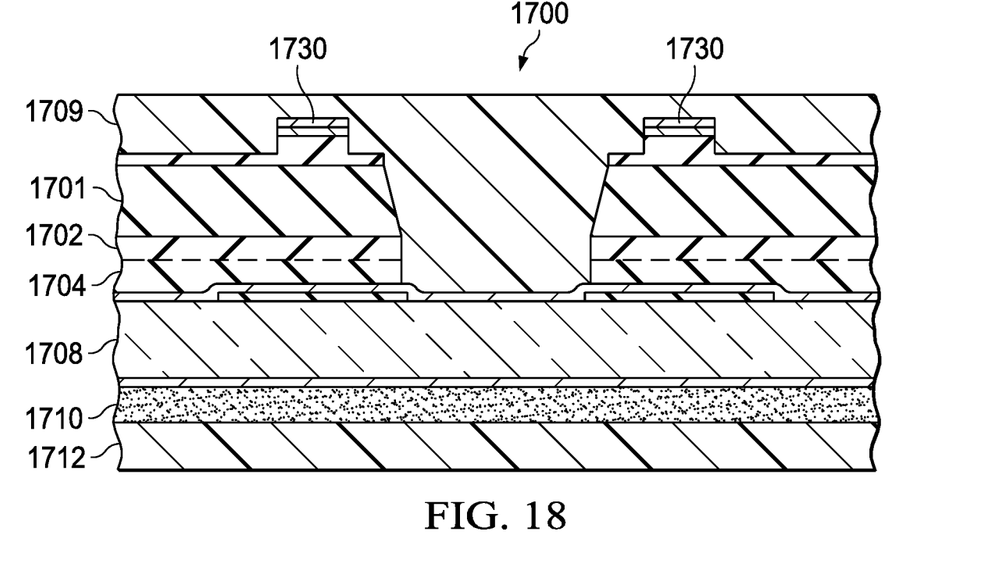
FIGS. 18-21 illustrate a wafer-level sequence of operations in accordance with an example of a hermetically bonded structure.

The structure 1700 shown in FIGS. 18-21 includes multiple layers including, for example, an interposer 1701, a thermal oxide layer 1702, a plasma oxide layer 1704, and a glass layer 1708 (e.g., borosilicate glass). The glass layer 1708 is adhered to a carrier fixture 1712 using an adhesive material 1710 (e.g., tape or other type of temporary adhesive). Structures 1730 provide electrical connectivity to contact pads on a semiconductor wafer 1800 (FIG. 18). A photoresist layer 1709 is provided as well as shown in FIG. 18. The photoresist is subsequently removed.

Figure 19:
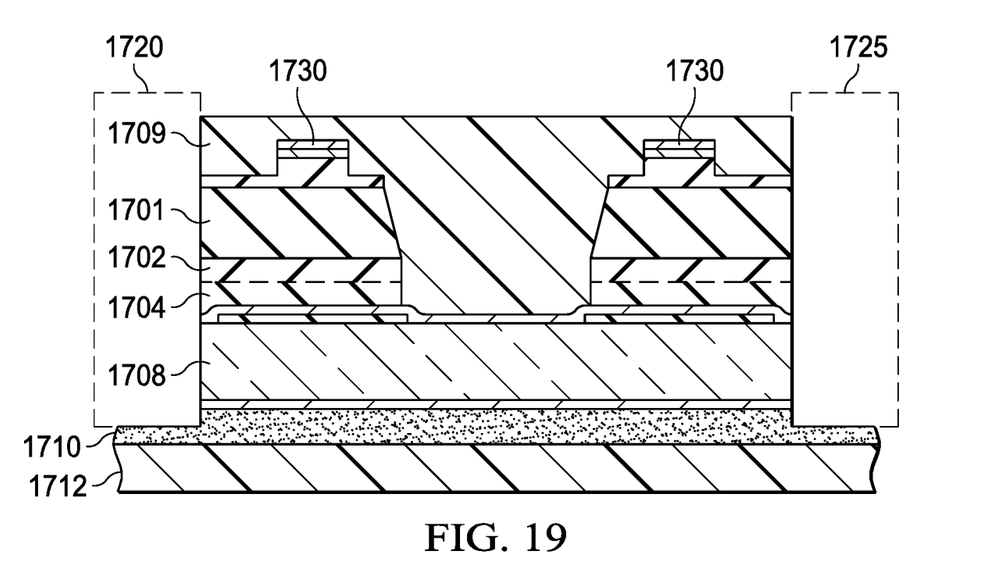
Figure 20:
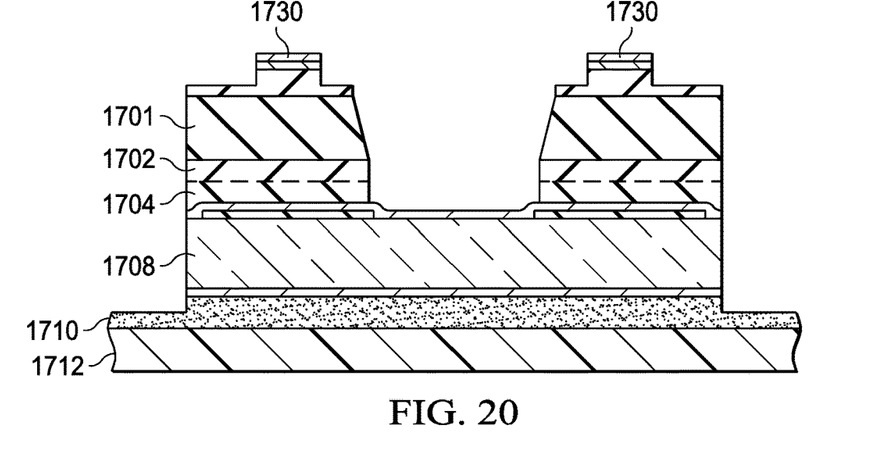
Figure 21:
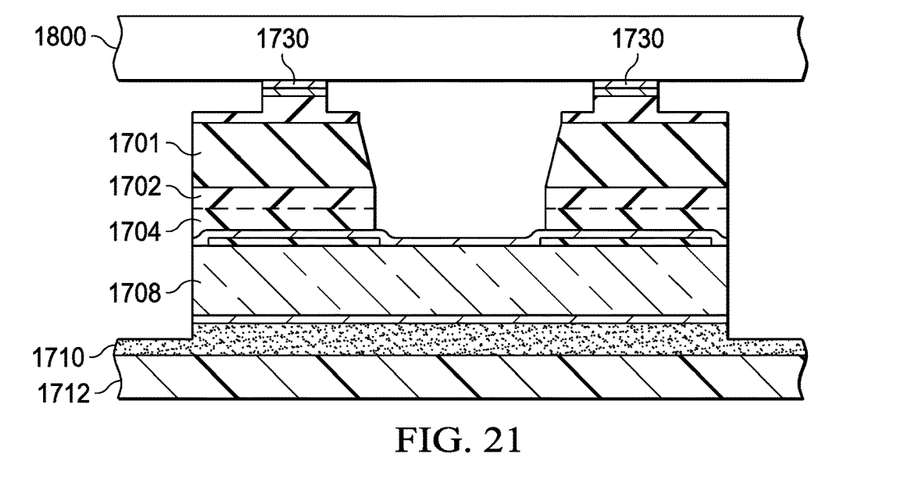

As illustrated in FIG. 19, cuts 1720 and 1725 are made through the stack of the interposer 1701, thermal oxide layer 1702, plasma oxide layer 1704, and the glass layer 1708 into the adhesive material 1710 thereby defining removal portions 1740. Such cuts can be made using a saw or other suitable type of device. FIG. 21 illustrates that a semiconductor wafer 1800 is adhered to the structures 1730. The carrier fixture 1712 can then be removed.

Figure 22:
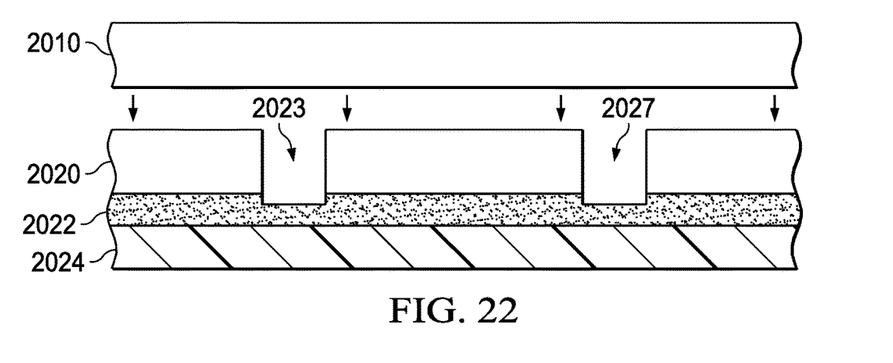
FIG. 22 shows an example of a wafer level packaging to produce a stacked die structure.

FIG. 22 illustrates an example of wafer-level packaging involving wafers 2010 and 2020. Each wafer 2010, 2020 may comprise a semiconductor wafer including one or more integrated circuits, and the wafers are to be bonded together to form a plurality of stacked die structures. Wafer 2020 is shown attached to a carrier fixture 2024 by way of adhesive 2022. Wafer 2020 is singulated while on the carrier fixture 2024 via cuts made at 2023 and 2027 but the singulated portions of wafer 2020 remain held in place on the carrier fixture 2024 due to the adhesive 2022.

The wafer 2010 is then bonded to wafer 2020. Wafer 2010 then can be singulated at or near the cuts to wafer 2020 made at 2023 and 2027 to thereby form multiple stacked die structures. Because wafer 2020 was singulated while retained in place on the carrier fixture 2024 and because wafer 2010 is adhered to the singulated dies of wafer 2020, the wafer-level packaging of FIG. 22 does not require any pick-and-place of individual dies onto wafer 2020, and is thus a faster and more efficient process than if wafer 2010 had already been singulated and pick-and-place was needed to form the stacked structures. The stacked dies may then be removed from the carrier fixture 2024.

In all of the examples described herein, the resulting structures may be attached to a leadframe and then a mold compound may be used to partially or fully encapsulate the dies. In the case of a DMD, the mirror array remains optically exposed through the window assembly 100.

Modifications are possible in the described embodiments, and other embodiments are possible, within the scope of the claims.

What is claimed is:

1. A method of producing a device, the method comprising:
    forming an opening through a first wafer, the first wafer having a first side and a second side, the first side of the first wafer on a carrier;
    attaching the second side of the first wafer to first side a second wafer; and
    removing the carrier from the first side of the first wafer, exposing a portion of the first side of the second wafer.

2. The method of claim 1, wherein the first wafer is a glass wafer and the second wafer is a semiconductor wafer.

3. The method of claim 2, wherein the semiconductor wafer comprises an electrical connection pad on the exposed portion of the semiconductor wafer.

4. The method of claim 3, further comprising testing integrated circuits in the semiconductor wafer using the electrical connection pad.

5. The method of claim 1, wherein the first wafer is a window assembly and the second wafer is a semiconductor wafer.

6. The method of claim 1, further comprising attaching the carrier to the first wafer using tape, and wherein removing the carrier from the first wafer comprises exposing the tape to ultraviolet light.

7. The method of claim 1, further comprising singulating the second wafer at the exposed portion of the second wafer.

8. The method of claim 1, wherein forming the opening comprises:
    making a first cut through the first wafer; and
    making a second cut through the first wafer, the second cut spaced away from the first cut, and wherein removing the carrier comprises removing a portion of the first wafer between the first cut and the second cut.

9. The method of claim 8, wherein the carrier has a recess, wherein making the first cut comprises making the first cut through the first wafer in the recess, and wherein making the second cut comprises making the second cut through the first wafer in the recess.

10. A method of producing a device, the method comprising:
    attaching a first side of a window assembly to a carrier;
    removing a portion of the window assembly through the window assembly;
    attaching a second side of the window assembly to a semiconductor wafer; and
    removing the carrier from the first side of the window assembly, exposing a portion of the semiconductor wafer.

11. The method of claim 10, wherein the semiconductor wafer comprises a digital micromirror device (DMD).

12. The method of claim 10, wherein the window assembly comprises a glass wafer and an interposer.

13. The method of claim 10, wherein the semiconductor wafer comprises an electrical connection pad on the exposed portion of the semiconductor wafer.

14. The method of claim 13, further comprising testing integrated circuits in the semiconductor wafer using the electrical connection pad.

15. The method of claim 10, wherein removing a portion of the window assembly comprises:
    making a first cut through the window assembly; and
    making a second cut through the window assembly, the second cut spaced away from the first cut, and wherein removing the carrier comprises removing a portion of the window assembly between the first cut and the second cut.

16. The method of claim 10, further comprising singulating the semiconductor wafer at the exposed portion of the semiconductor wafer.

17. The method of claim 10, further comprising attaching the carrier to the window assembly using tape, and wherein removing the carrier from the window assembly comprises exposing the tape to ultraviolet light.

18. A method of producing a device, the method comprising:
    attaching a glass layer of a stack to a carrier;
    forming cuts through the stack;
    removing a photoresist layer of the stack; and
    attaching a semiconductor wafer to the stack, to form a cavity between the glass layer and the semiconductor wafer.

19. The method of claim 18, wherein the stack comprises:
    a plasma oxide layer on the glass layer;
    a thermal oxide layer on the plasma oxide layer;
    an interposer on the thermal oxide layer; and
    an electrical structure on the interposer.

20. The method of claim 18, further comprising removing the carrier.

* * * * *